(12) United States Patent
Urabe

(10) Patent No.: US 6,383,302 B2
(45) Date of Patent: *May 7, 2002

(54) APPARATUS AND METHOD FOR MANUFACTURING SEMICONDUCTOR DEVICE

(75) Inventor: Koji Urabe, Tokyo (JP)

(73) Assignee: NEC Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/203,816

(22) Filed: Dec. 2, 1998

(30) Foreign Application Priority Data

Dec. 2, 1997 (JP) ............................... 9-332050

(51) Int. Cl.⁷ ............................... C23C 16/00
(52) U.S. Cl. ................ 118/725; 118/620; 118/641; 219/390
(58) Field of Search .................... 361/234; 118/500, 118/712, 715, 719, 725, 728, 730, 620, 641; 216/2, 22, 35, 37, 52, 65, 75, 85, 86, 89; 136/246; 156/345; 219/390

(56) References Cited

U.S. PATENT DOCUMENTS 5,886,863 A * 3/1999 Nagasaki et al. ............ 361/234

FOREIGN PATENT DOCUMENTS

| JP | 2-237111 | * | 6/1978 | |
| JP | 53-66164 | * | 6/1978 | |
| JP | 54-157778 | * | 12/1979 | |
| JP | 58-25244 | * | 2/1983 | |
| JP | 61-7622 | * | 1/1986 | |
| JP | 63-53272 | | 3/1988 | ............ C23C/16/46 |
| JP | 2-237111 | | 9/1990 | ............ H01L/21/22 |
| JP | 3183151 | | 8/1991 | ............ H01L/21/68 |

OTHER PUBLICATIONS

Smith et al, "Chemical Vapor deposition of titanium–silicon–nitride film", Appl. Phys. Lett. 70 (23), pp. 3116–3118, Jun. 1997.*
J.Vac.Sci.Tech. A 3(5), 9.85, pp. 1969–1972, Sep. 1985.*
J.Vac.Sci.Tech. A 9(4), 7.91, pp. 2196–2203, Jul. 1991.*
J.Vac.Sci.Tech. A 16(3), 5.98, pp. 1686–1691, May 1998.*
J.Vac.Sci.Tech. B 17(2), 5.99, pp. 840–844, May 1999.*
S. Hampshire, "Engineering Properties of Nitrides", Engineering Materials Handbook, vol. 4—Ceramics and Glasses, The Materials Information Society, Sep. 1985.*
J. Vac. Sci. & Tech. A, 12 (4) pp. 1032–1038, Jul. 1994.*
Appl. Phys. Lett. 70 (23), pp. 3116–3118, Mar. 1997.*

* cited by examiner

Primary Examiner—Gregory Mills
Assistant Examiner—Rudy Zervigon
(74) Attorney, Agent, or Firm—Hayes Soloway P.C.

(57) ABSTRACT

In a semiconductor device manufacturing apparatus comprising at least a reaction chamber and a substrate holder located within the reaction chamber, a silicon nitride film is deposited on the substrate holder within the reaction chamber, and then, a semiconductor substrate is put on the silicon nitride film of the substrate holder within the reaction chamber. A titanium film or a titanium nitride film is deposited on the semiconductor substrate within the reaction chamber, by a chemical vapor deposition process using a titanium halide as a raw material gas.

6 Claims, 5 Drawing Sheets

APPARATUS AND METHOD FOR MANUFACTURING SEMICONDUCTOR DEVICE

BACKGROUND OF THE INVENTION

1. Field of the Invention

The present invention relates to an apparatus and a method for manufacturing a semiconductor device, and more specifically to a semiconductor device manufacturing apparatus and method for forming a titanium film or a titanium nitride film by use of a chemical vapor deposition process using a titanium halide as a raw material gas.

2. Description of Related Art

A prior art semiconductor device manufacturing method for forming a titanium film and a titanium nitride film in a contact hole of a semiconductor device, by use of a chemical vapor deposition process using a titanium halide as a raw material gas, will be described with reference to FIG. 4, which is a diagrammatic view of a reaction chamber of a chemical vapor deposition apparatus for depositing a titanium film and a titanium nitride film by using a titanium halide as a raw material.

In a reaction chamber 300, a substrate holder 10 for holding a semiconductor substrate thereon, is formed of a nickel-based alloy having an excellent corrosion resistant property against chlorine. The substrate holder 10 is coated with a titanium nitride film (called a "pre-coated titanium nitride film" hereinafter) 13 in order to prevent the metal of the substrate holder 10 from reacting with the silicon of a bottom surface of a semiconductor substrate such a silicon substrate 1.

Here, the pre-coated titanium nitride film 13 is formed by a chemical vapor deposition process (called a "CVD process" hereinafter) performed in the reaction chamber 300 using titanium tetrachloride, ammonia and nitrogen as a raw material gas, before the process for depositing a film on the silicon substrate 1 is carried out.

A resistor heater 14 is incorporated in the substrate holder 10 to control the temperature of the substrate holder 10 in a film deposition process. An evacuating line 15 is provided for exhausting from the reaction chamber 300, a reaction gas generated in the course of the film deposition process and unreacted gas. An upper electrode 16 is provided at an upper portion of the reaction chamber 300.

Next, the prior art semiconductor device manufacturing method will be described with reference to FIGS. 5A to 5D, which are diagrammatic sectional views for illustrating various steps in the semiconductor device manufacturing process.

As shown in FIG. 5A, a device isolation oxide film 2 having a thickness of 200 nm is formed on a principal surface of a silicon substrate 1 by a conventional method, and a predetermined impurity is doped into the principal surface of the silicon substrate 1, so that a diffused layer 3 is formed.

Then, an insulating film 4 having a thickness of 1500 nm is formed on the principal surface of the silicon substrate 1, and a portion of the insulating film 4 positioned on the diffused layer 3 is selectively removed so that a contact hole 5 is formed through the insulating film 4.

Thereafter, as shown in FIG. 5B, a titanium film 6 having a thickness of 10 nm is deposited on an upper surface of the insulating film 4 and an inner surface of the contact hole 5, by a CVD process using titanium tetrachloride, hydrogen and argon as a raw material gas. In the same process, a titanium silicide film 7 having a thickness of 20 nm is formed on the upper surface of the diffused layer 3.

Then, as shown in FIG. 5C, the titanium film 6 on the surface of the insulating film 4 is nitrided by ammonia in the reaction chamber 300 (FIG. 4), so that a titanium nitride film 8 is formed.

Then, as shown in FIG. 5D, a titanium nitride film 9 having a thickness of 500 nm is deposited on a surface of a titanium nitride film 8 and the titanium silicide film 7, by the CVD process using titanium tetrachloride, ammonia and nitrogen as a raw material gas.

In the above mentioned process for forming the titanium film and the titanium nitride film by using the titanium tetrachloride, since the substrate holder is exposed to an active chlorine atmosphere at a temperature of 500° C. to 600° C., the substrate holder is required to have the nature that a thermal deformation such as a thermal expansion and a plastic deformation is low, a high electric conductivity, a high heat conductivity and a high-temperature corrosion resistant property.

The vapor pressure of nickel chloride is the least within chlorides of refractory metals, and a nickel-based alloy is widely known as a heat resistant material for a structural member. In addition, the nickel-based alloy has some degree of electric conductivity and some degree of heat conductivity. Therefore, the nickel-based alloy has been used as a material of the prior art substrate holder. In addition, when a metal substrate holder is used, the pre-coated titanium nitride film is formed as mentioned above in order to prevent a reaction with the silicon of the bottom surface of the substrate.

If the substrate holder is formed of a ceramic material, since the ceramic material is low in heat conductivity, a long time is required to heat the substrate, and since the electric conductivity is low, the substrate potential varies in a high frequency discharge. These are problems.

A method for coating the metal substrate-holder with an insulating film by use of a CVD process is disclosed in Japanese Patent Application Pre-examination Publication No. JP-A-03-183151, (the content of which is incorporated by reference in its entirety into this application, and also an English abstract of JP-A-03-183151 is available from the Japanese Patent Office and the content of the English abstract of JP-A-03-183151 is also incorporated by reference in its entirety into this application). In the method disclosed in JP-A-03-183151, the coating of the metal substrate-holder upper surface by the insulating film is previously carried out in a predetermined reaction chamber which is different from the reaction chamber in which the metal substrate-holder is to be installed. Therefore, the insulating film formed in the predetermined reaction chamber is required to be resistant to heat stress caused by a heat history from an ordinary room temperature to a process temperature. Accordingly, the combination of the metal material used to form the substrate holder with the insulating film formed on the upper surface of the metal substrate-holder is restricted to ones which have a thermal characteristics near to each other.

However, the following problem has been encountered in the prior art semiconductor device manufacturing apparatus and method mentioned above.

Since the substrate holder is coated with the precoated titanium nitride film, it is possible to prevent the reaction between the silicon of the substrate bottom surface and the metal of the substrate holder. However, the nickel and the other metal(s) of the substrate holder are corroded through the precoated titanium nitride film by active chlorine generated in the process of depositing the titanium film and the titanium nitride film using the titanium tetrachloride.

As a result of the corrosion, a vapor of nickel chloride and chloride of the other metal(s) is generated in the reaction chamber, with the result that nickel and the other metal(s) are deposited on the surface of the silicon substrate because of a silicon reduction reaction of the chloride of the nickel and the other metal(s) at the surface of the silicon substrate.

The nickel and the other metal(s) deposited on the substrate surface diffuse into the interior of the substrate when the substrate holder temperature is high. As a result, impurity energy level(s) caused by the contaminating metals are formed in a junction near to the contact hole in the semiconductor device, so that a junction leakage current is apt to occur, and therefore, stable electric characteristics of the contact electrode cannot be obtained.

SUMMARY OF THE INVENTION

Accordingly, it is an object of the present invention to provide a semiconductor device manufacturing apparatus and method which have overcome the above mentioned defect of the conventional one.

Another object of the present invention is to provide a semiconductor device manufacturing apparatus and method, capable of preventing generation of a metal contaminating the semiconductor device, in a reaction chamber.

The above and other objects of the present invention are achieved in accordance with the present invention by a semiconductor device manufacturing apparatus for forming a titanium film or a titanium nitride film on a principal surface of a semiconductor substrate by a chemical vapor deposition process using a titanium halide as a raw material gas, the apparatus comprising at least a reaction chamber and a substrate supporting member located within the reaction chamber for supporting the semiconductor substrate thereon, the substrate supporting member being coated with a silicon nitride film.

Preferably, the silicon nitride film is a silicon nitride film deposited within the reaction chamber. In one embodiment, the silicon nitride film is further coated with a titanium nitride film. This titanium nitride film is preferably a titanium nitride film deposited within the reaction chamber.

According to another aspect of the present invention, there is provided a semiconductor device manufacturing method for forming a titanium film or a titanium nitride film on a principal surface of a semiconductor substrate by a chemical vapor deposition process using a titanium halide as a raw material gas, the method using a semiconductor device manufacturing apparatus comprising at least a reaction chamber and a substrate supporting member located within the reaction chamber and coated with a silicon nitride film, locating a semiconductor substrate on the silicon nitride film of the substrate supporting member within the reaction chamber, and depositing a titanium film or a titanium nitride film on the semiconductor substrate held on the substrate supporting member within the reaction chamber, by a chemical vapor deposition process using a titanium halide as a raw material gas.

In one embodiment, the silicon nitride film is further coated with a titanium nitride film, and the semiconductor substrate is located on the titanium nitride film of the substrate supporting member.

According to still another aspect of the present invention, there is provided a semiconductor device manufacturing method for forming a titanium film or a titanium nitride film on a principal surface of a semiconductor substrate by a chemical vapor deposition process using a titanium halide as a raw material gas, the method using a semiconductor device manufacturing apparatus comprising at least a reaction chamber and a substrate supporting member located within the reaction chamber, depositing a silicon nitride film on the substrate supporting member within the reaction chamber, locating a semiconductor substrate on the silicon nitride film of the substrate supporting member within the reaction chamber, and depositing a titanium film or a titanium nitride film on the semiconductor substrate held on the substrate supporting member within the reaction chamber, by a chemical vapor deposition process using a titanium halide as a raw material gas.

In one embodiment, the silicon nitride film is further coated with a titanium nitride film, and the semiconductor substrate is located on the titanium nitride film of the substrate supporting member.

The above and other objects, features and advantages of the present invention will be apparent from the following description of preferred embodiments of the invention with reference to the accompanying drawings.

DESCRIPTION OF THE PREFERRED EMBODIMENTS

Now, a first embodiment of the semiconductor device manufacturing apparatus in accordance with the present invention will be described with reference to FIG. 1, which is a diagrammatic view of the first embodiment of the semiconductor device manufacturing apparatus in accordance with the present invention.

Figure 1:
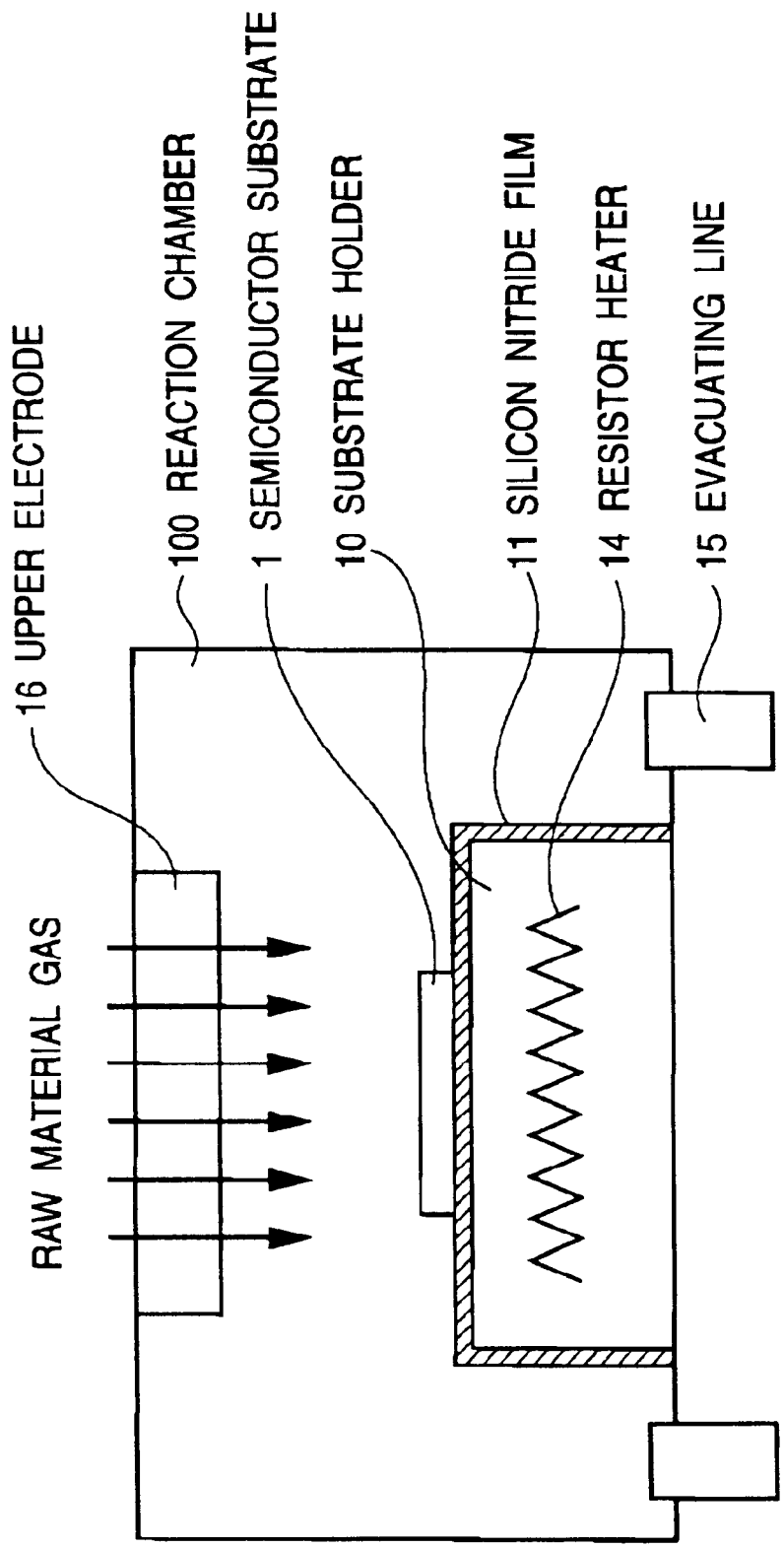
FIG. 1 is a diagrammatic view of a first embodiment of the semiconductor device manufacturing apparatus in accordance with the present invention.

Referring to FIG. 1, the semiconductor device manufacturing apparatus includes a reaction chamber 100 in which a titanium film and a titanium nitride film are deposited. Within the reaction chamber 100, a substrate holder 10 is provided, which is formed of a nickel-based alloy having an excellent corrosion resistant property against chlorine. A resistor heater 14 is incorporated in the substrate holder 10 to control the temperature of the substrate holder 10 in a film deposition process. An evacuating line 15 is provided for exhausting from the reaction chamber 100, a reaction gas generated in the course the film deposition process and an unreacted gas. An upper electrode 16 is provided at an upper portion of the reaction chamber 100.

The substrate holder 10 is coated with a silicon nitride film 11 having a thickness of about 500 nm. This silicon nitride film 11 is formed by a thermal CVD process in the reaction chamber 100, before the titanium film and the titanium nitride film are deposited on a principal surface of a semiconductor substrate such as a silicon substrate 1 in the same reaction chamber 100. For example, the silicon nitride film 11 is formed under the condition in which the temperature of the substrate holder 10 is 650° C., the pressure of the reaction chamber 100 is 1 Torr, a flow rate of silane ($SiH_4$) gas is 50 sccm, a flow rate of ammonia gas is 150 sccm, and a flow rate of argon (Ar) gas is 100 sccm. The temperature of the substrate holder 10 is controlled by the heater 14.

In the case that a high frequency electrode is provided in the reaction chamber, the silicon nitride film 11 can be formed by a plasma CVD process.

Next, a first embodiment of the semiconductor device manufacturing method which uses the first embodiment of the semiconductor device manufacturing apparatus mentioned above, will be described with reference to FIGS. 2A to 2D, which are diagrammatic sectional views for illustrating various steps in the semiconductor device manufacturing process.

Figure 2A:
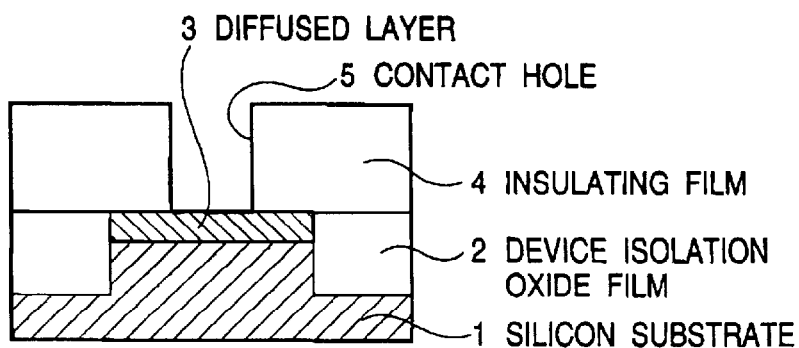
FIGS. 2A to 2D are diagrammatic sectional views for illustrating various steps in a first embodiment of the semiconductor device manufacturing process in accordance with the present invention.

As shown in FIG. 2A, a device isolation oxide film 2 having a thickness of 200 nm is formed on a principal surface of a silicon substrate 1 by a conventional method, and a predetermined impurity is doped into the principal surface of the silicon substrate 1, so that a diffused layer 3 is formed.

Then, an insulating film 4 having a thickness of 1500 nm is formed on the principal surface of the silicon substrate 1, and a portion of the insulating film 4 positioned on the diffused layer 3 is selectively removed so that a contact hole 5 penetrating through the insulating film 4 is formed on the diffused layer 3.

Figure 2B:
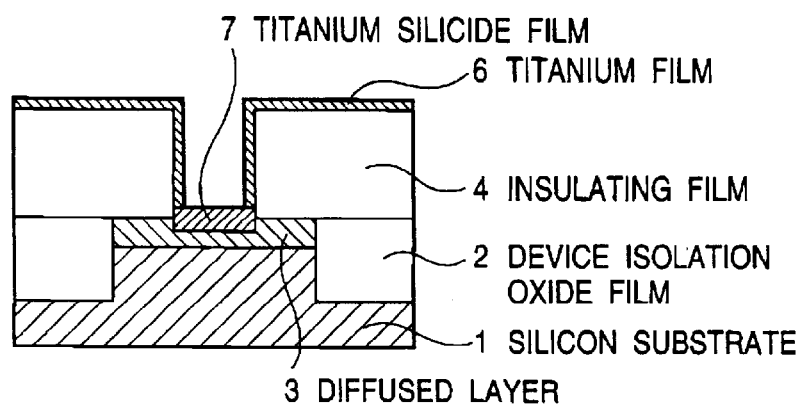

Thereafter, as shown in FIG. 2B, a titanium film 6 having a thickness of 10 nm is deposited on an upper surface of the insulating film 4 and an inner surface of the contact hole 5, by a CVD process under the condition in which for example, the temperature of the substrate holder 10 is 500° C., the pressure of the reaction chamber 100 is 5 Torr, and a high frequency discharge power is 500 kW, and using as a raw material gas, a mixed gas composed of titanium tetrachloride of 2 sccm in flow rate, hydrogen of 1000 sccm in flow rate, and argon of 500 sccm in flow rate. In the same process, a titanium silicide film 7 having a thickness of 20 nm is formed on the upper surface of the diffused layer 3.

Figure 2C:
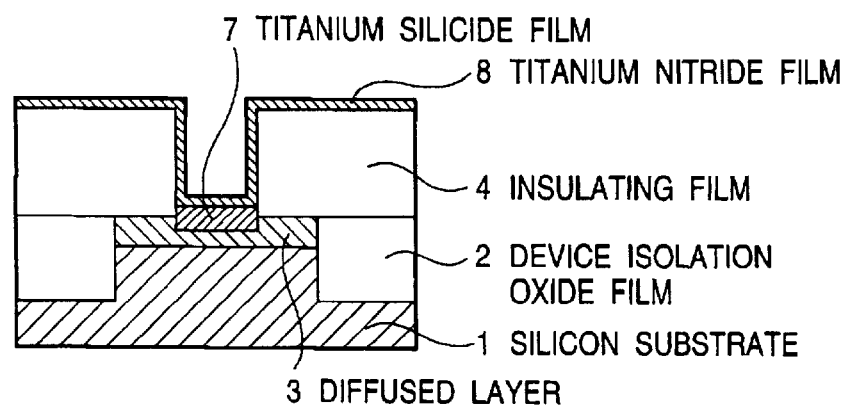

Then, as shown in FIG. 2C, the titanium film 6 on the surface of the insulating film 4 is nitrided by ammonia of 100 sccm in flow rate, in the reaction chamber 100 (FIG. 1) under the condition in which for example, the temperature of the substrate holder 10 is 600° C., the pressure of the reaction chamber 100 is 20 Torr, a high frequency discharge power is 500 kW, so that a titanium nitride film 8 is formed.

Figure 2D:
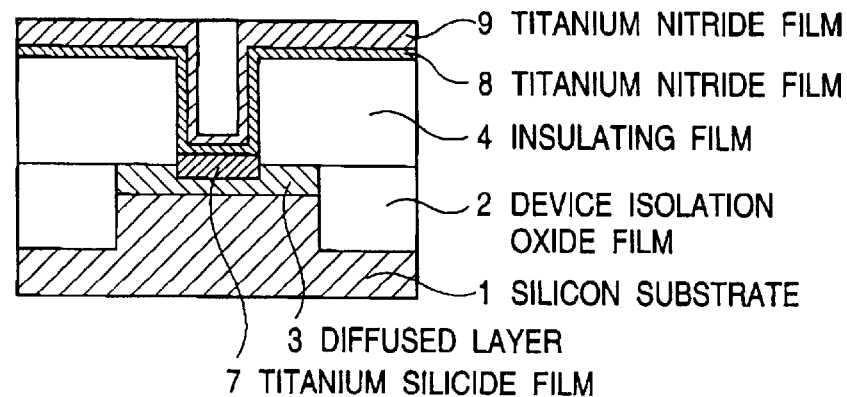

Then, as shown in FIG. 2D, a titanium nitride film 9 having a thickness of 500 nm is deposited on a surface of the titanium nitride film 8 and the titanium silicide film 7, by the CVD process under a condition in which for example, the temperature of the substrate holder 10 is 600° C. and the pressure of the reaction chamber 100 is 20 Torr, and using as a raw material gas, a mixed gas composed of titanium tetrachloride of 40 sccm in flow rate, ammonia of 100 sccm in flow rate, and nitrogen of 3000 sccm in flow rate.

In the above mentioned first embodiment, since the substrate holder 10 provided in the reaction chamber 100, in which the titanium film and the titanium nitride film are deposited, is coated with the silicon nitride film 11, the substrate holder 10 is not corroded by the titanium tetrachloride which is the raw material gas, and by hydrogen chloride which is the reaction product. Therefore, since the nickel-base alloy forming the substrate holder 10 is not corroded, a vapor of nickel chloride is not generated in the reaction chamber 100. As a result, metal contamination of the semiconductor substrate 1 is minimized, so that the stability of the electric characteristics of the contact electrode in the semiconductor device is elevated.

Furthermore, since the nitride film is formed in the reaction chamber 100, there does not occur a crack which might otherwise occur in the silicon nitride film because of a thermal stress generated in the course of moving between a process temperature and ordinary room temperature when the nitride film is formed in another apparatus. Therefore, the silicon nitride film can prevent the substrate holder 10 from being influenced by active chlorine.

Figure 3:
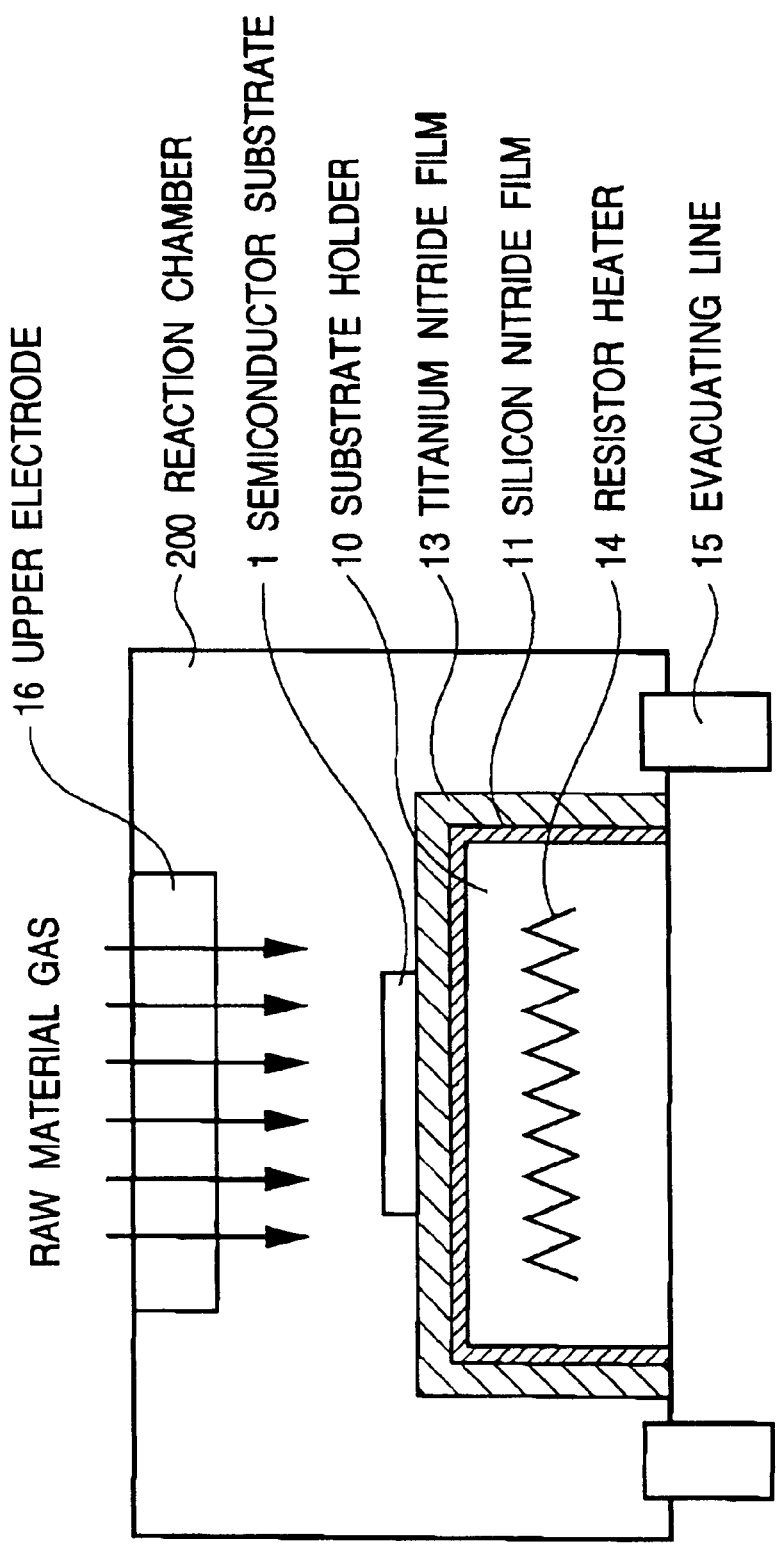
FIG. 3 is a diagrammatic view of a second embodiment of the semiconductor device manufacturing apparatus in accordance with the present invention.
Figure 4:
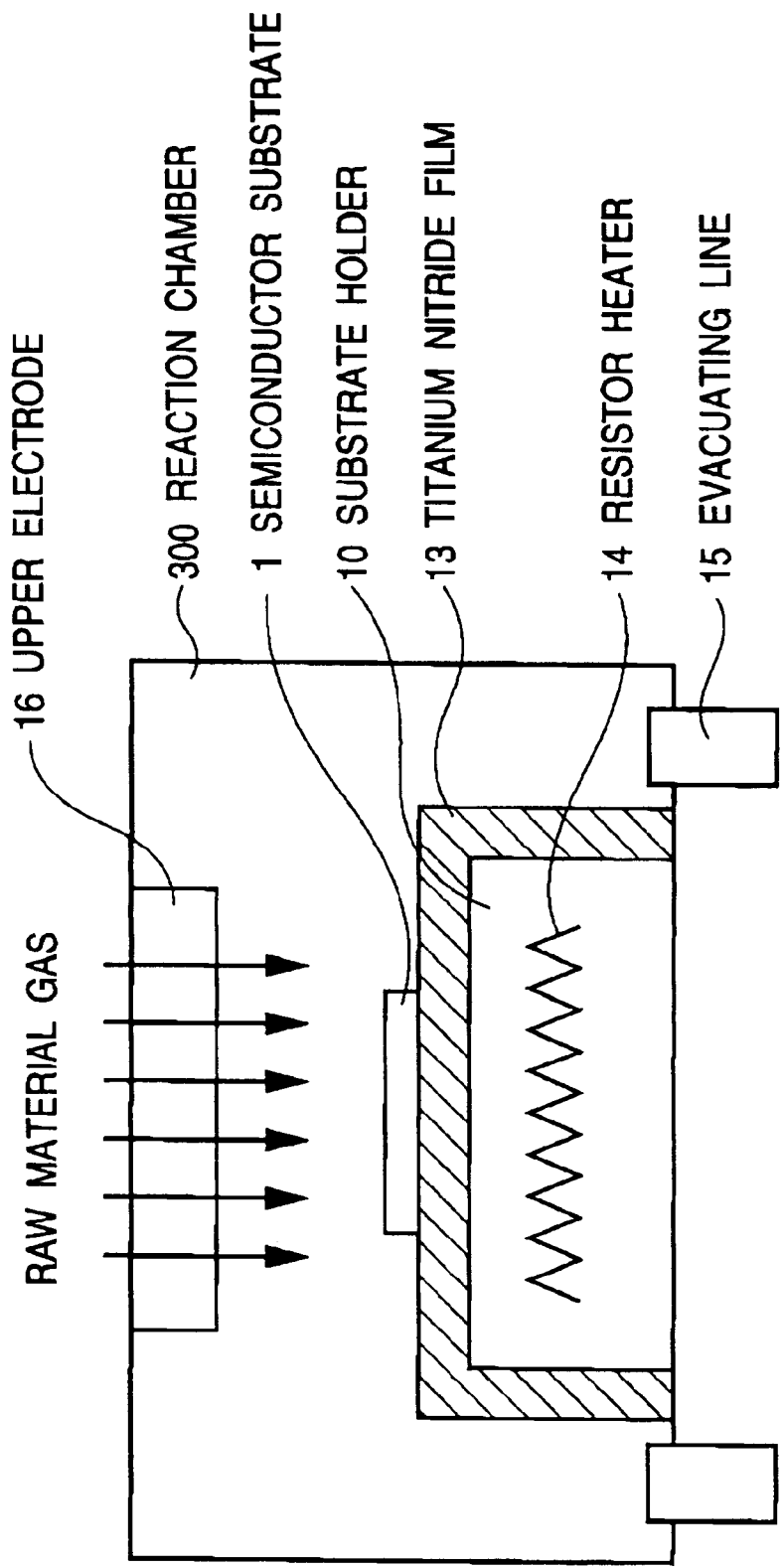
FIG. 4 is a diagrammatic view of the prior art semiconductor device manufacturing apparatus.
Figure 5A:
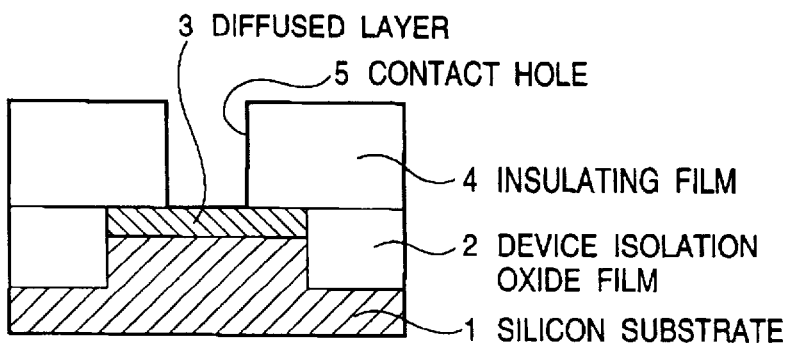
FIGS. 5A to 5D are diagrammatic sectional views for illustrating various steps in the prior art semiconductor device manufacturing process.
Figure 5B:
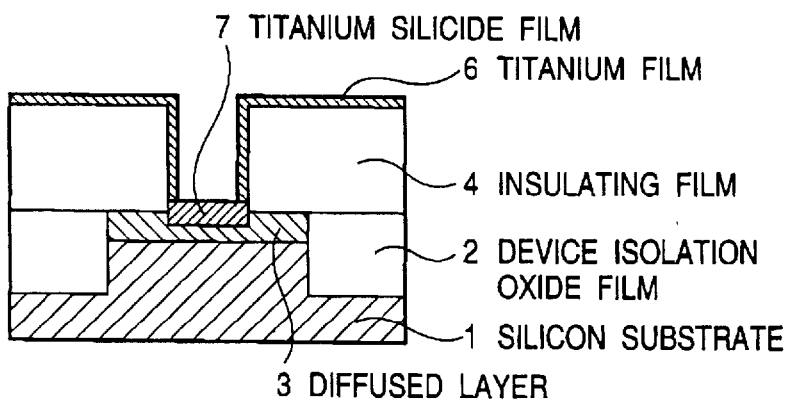
Figure 5C:
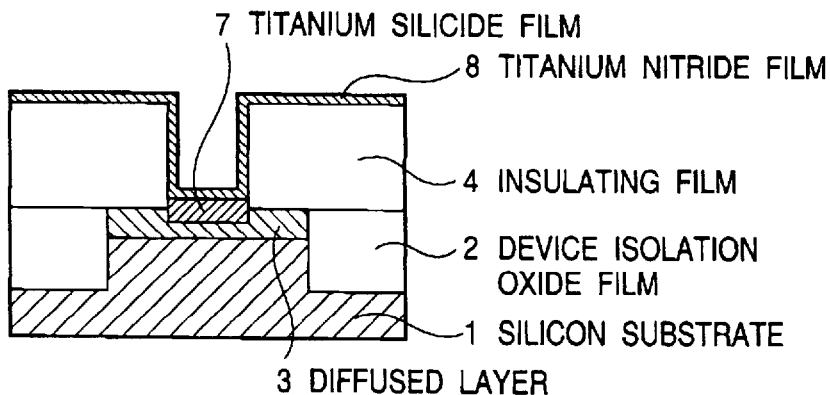
Figure 5D:
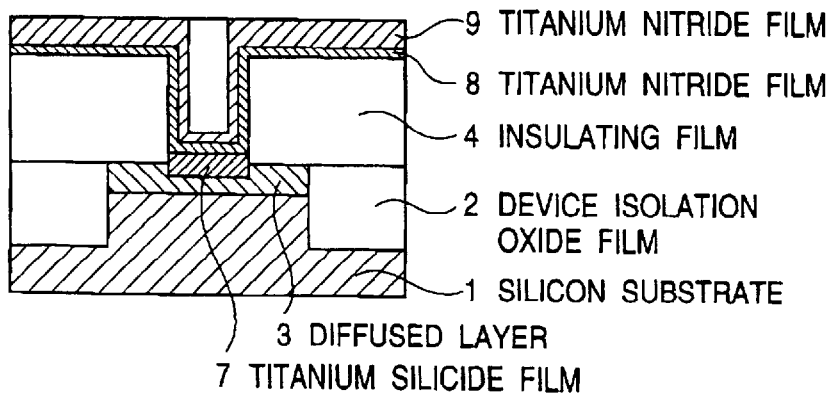

Now, a second embodiment of the semiconductor device manufacturing apparatus in accordance with the present invention will be described with reference to FIG. 3, which is a diagrammatic view of the second embodiment of the semiconductor device manufacturing apparatus in accordance with the present invention. In FIG. 3, element corresponding to those shown in FIG. 1 are given the same Reference Numerals, and explanation will be omitted.

Referring to FIG. 3, the semiconductor device manufacturing apparatus includes a reaction chamber 200 in which a titanium film and a titanium nitride film are deposited. Within the reaction chamber 100, a substrate holder 10 is provided, which is formed of a nickel-based alloy having an excellent corrosion resistant property against chlorine. A resistor heater 14 is incorporated in the substrate holder 10 to control the temperature of the substrate holder 10 in a film deposition process.

A surface of the substrate holder 10 is coated with a silicon nitride film 11 having a thickness of about 500 nm. This silicon nitride film 1 is formed by a thermal CVD process in the reaction chamber 200, before the titanium film and the titanium nitride film are deposited on an upper surface of a semiconductor substrate such as a silicon substrate 1 in the same reaction chamber 200. For example, the silicon nitride film 11 is formed under the condition in which the temperature of the substrate holder 10 is 650° C., the pressure of the reaction chamber 100 is 1 Torr, a flow rate of silane ($SiH_4$) gas is 50 sccm, a flow rate of ammonia gas is 150 sccm, and a flow rate of argon (Ar) gas is 100 sccm. The temperature of the substrate holder 10 is controlled by the heater 14.

In the case that a high frequency electrode is provided in the reaction chamber, the silicon nitride film 11 can be formed by a plasma CVD process.

Furthermore, the silicon nitride film 11 is coated with a titanium nitride film 13 having a thickness of for example 500 nm. This titanium nitride film 13 is formed by a thermal CVD process or a plasma CVD process under condition in which for example the temperature of the substrate holder 10 is 600° C and the pressure is 20 Torr, and using as a raw material gas, a mixed gas composed of titanium tetrachloride of 40 sccm in flow rate, ammonia of 100 sccm in flow rate, and nitrogen of 3000 sccm in flow rate. The temperature of the substrate holder 10 is controlled by the heater 14.

With provision of the titanium nitride film 13, electric conductivity between the semiconductor substrate and the substrate holder is improved.

A semiconductor device manufacturing method using the second embodiment of the semiconductor device manufacturing apparatus as mentioned above is the same as the semiconductor device manufacturing method explained with reference to FIGS. 2A to 2D, using the first embodiment of the semiconductor device manufacturing apparatus. Therefore, explanation will be omitted.

In this second embodiment, since the substrate holder 10 provided in the reaction chamber 200, in which the titanium film and the titanium nitride film are deposited, is coated with the silicon nitride film 11, the substrate holder 10 is not corroded by the titanium tetrachloride which is the raw material gas, and by hydrogen chloride which is the reaction product. Therefore, since the nickel-base alloy forming the substrate holder 10 is not corroded, a vapor of nickel chloride is not generated in reaction chamber 100. As a result, the metal contamination of the semiconductor substrate 1 is minimized, so that the stability of the electric characteristics of the contact electrode in the semiconductor device is elevated. In addition, since the silicon nitride film is coated with the titanium nitride film, it is possible to stabilize the potential of the substrate holder.

As mentioned above, according to the present invention, since the substrate holder provided in the reaction chamber for depositing the titanium film and in the reaction chamber for depositing the titanium nitride film, is coated with the silicon nitride film, the substrate holder is not corroded by the titanium tetrachloride which is the raw material gas, and by hydrogen chloride which is the reaction product. Therefore, since the nickel-base alloy forming the substrate holder is not corroded, a vapor of nickel chloride is not generated in the reaction chamber. As a result, the metal contamination of the semiconductor substrate is minimized, so that the stability of the electric characteristics of the contact electrode in the semiconductor device is elevated. In addition, if the silicon nitride film is coated with the titanium nitride film, it is possible to stabilize the potential of the substrate holder.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor device manufacturing apparatus for forming a titanium film or a titanium nitride film on a principal surface of a semiconductor substrate by a chemical vapor deposition process using a titanium halide as a raw material gas, the apparatus comprising at least a reaction chamber and a substrate supporting member formed of a nickel-based alloy located within said reaction chamber for supporting said semiconductor substrate thereon, said substrate supporting member having a resistance heater incorporated therein, and being pre-coated on all exposed surfaces, including that portion of the surface of said substrate supporting member upon which said semiconductor substrate is supported during said chemical vapor deposition process, with a silicon nitride film, and an electrode in an upper portion of said reaction chamber.

2. A semiconductor device manufacturing apparatus claimed in claim 1 wherein said silicon nitride film is a silicon nitride film deposited in situ within said reaction chamber.

3. A semiconductor device manufacturing apparatus claimed in claim 2 wherein said silicon nitride film is further coated with a titanium nitride film.

4. A semiconductor device manufacturing apparatus claimed in claim 3 wherein said titanium nitride film is a titanium nitride film deposited in situ within said reaction chamber.

5. A semiconductor device manufacturing apparatus claimed in claim 1 wherein said silicon nitride film is further coated with a titanium nitride film.

6. A semiconductor device manufacturing apparatus claimed in claim 5 wherein said titanium nitride film is a titanium nitride film deposited in situ within said reaction chamber.

* * * * *